United States Patent [19]

Prezas et al.

[11] Patent Number: 4,581,747

[45] Date of Patent: Apr. 8, 1986

[54] ARRANGEMENT FOR EQUALIZING THE VARIABLE ATTENUATION OF A SIGNAL ON A COMMUNICATION LINE

[75] Inventors: Dimitrios P. Prezas, Park Ridge; Nancy M. Saraf, Lisle, both of Ill.

[73] Assignee: AT&T Bell Laboratories, Murray Hill, N.J.

[21] Appl. No.: 586,320

[22] Filed: Mar. 5, 1984

[51] Int. Cl.[4] .................... G06F 15/31; H03H 17/04
[52] U.S. Cl. ..................................... 375/14; 333/18; 364/724
[58] Field of Search ............... 381/36, 40, 51, 66, 381/98, 103; 333/18, 165; 364/724, 825; 375/12, 13, 14; 179/170.2

[56] References Cited

U.S. PATENT DOCUMENTS

| | | | |
|---|---|---|---|
| 3,662,108 | 5/1972 | Flanagan | 381/37 |
| 3,662,115 | 5/1972 | Saito | 381/40 |
| 4,377,793 | 3/1983 | Horna | 333/165 |
| 4,398,262 | 8/1983 | Williams | 364/724 |
| 4,454,590 | 6/1984 | Belt | 364/724 |

OTHER PUBLICATIONS

Lawrence R. Rabiner et al., *Digital Processing of Speech Signals*, Prentice-Hall, Inc., Englewood Cliffs, N.J., 1978, p. 416.

R. B. Blake et al., "Voice-Frequency Transmission Treatment for Special-Service Telephone Circuits", *The Bell System Technical Journal*, vol. 60, No. 7, Part 2, Sep. 1981, pp. 1585-1619.

*Primary Examiner*—Benedict V. Safourek
*Attorney, Agent, or Firm*—Richard J. Godlewski

[57] ABSTRACT

Disclosed is a digital arrangement utilizing linear predictive coding for equalizing over a desired frequency spectrum the variable attenuation of a voice-frequency message signal transmitted on a communication line. The arrangement comprises a digital signal processor, program memories for storing program instruction sets, and a data memory for storing samples of a spectrally white test signal that has been variably attenuated by the line. Under control of one instruction set that incorporates linear predictive coding, the processor uses the stored test samples to calculate the reflection coefficients of the line that characterize the variable attenuation of a signal on the line. Under the control of the other instruction set, the processor functions as a digital inverse filter employing the calculated reflection coefficients for equalizing over the desired frequency spectrum the variable attenuation of a voice-frequency message signal transmitted on the line.

19 Claims, 7 Drawing Figures

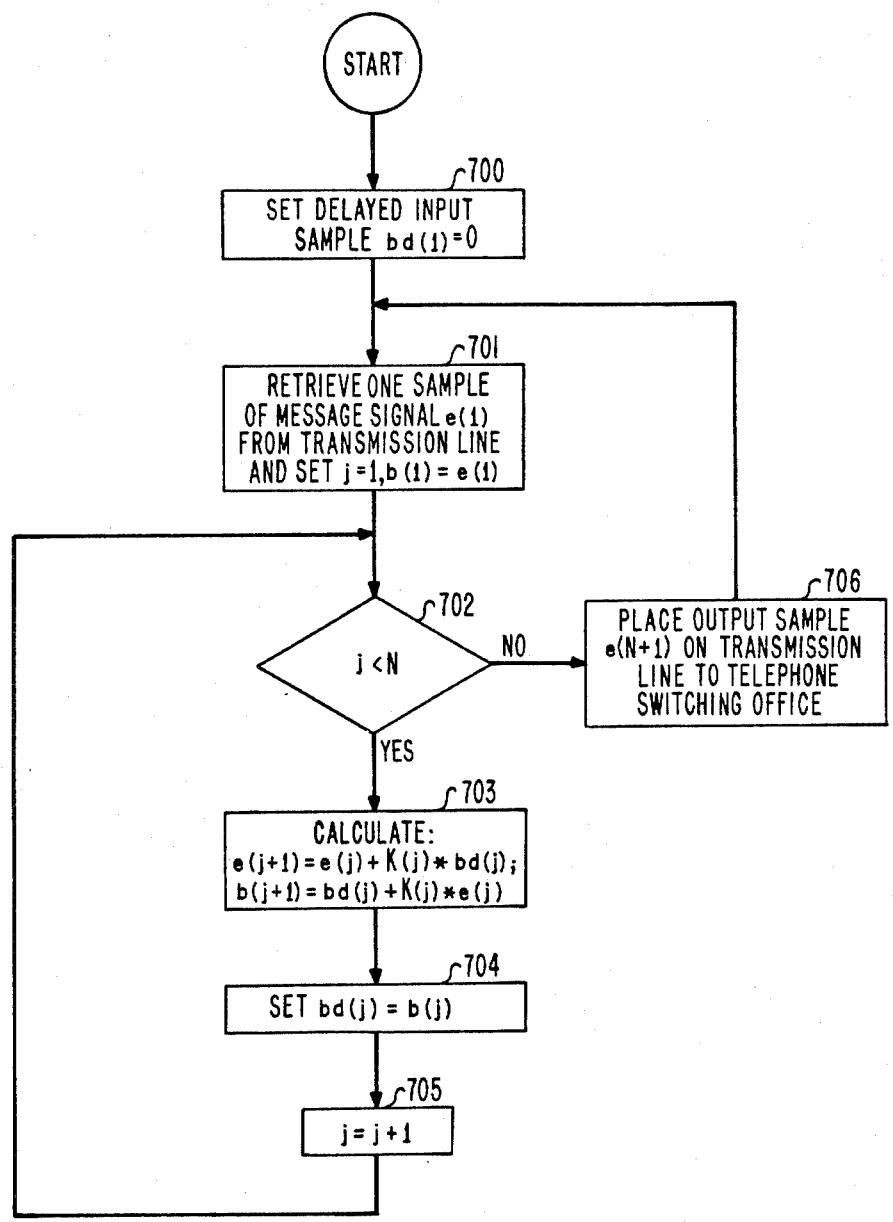

ARRANGEMENT FOR EQUALIZING THE VARIABLE ATTENUATION OF A SIGNAL ON A COMMUNICATION LINE

TECHNICAL FIELD

This invention relates generally to communication systems and particularly to an arrangement for equalizing the variable attenuation of a signal on a communication line.

BACKGROUND OF THE INVENTION

The digital filter is well known and used in a variety of applications. In one application, a digital filter equalizes the variable attenuation of a voice-frequency message signal that has been transmitted on a telecommunication line. Every voice-frequency message signal comprises a plurality of single-frequency component signals. Generally, the amount of component signal attenuation varies significantly over the frequency spectrum, and to compensate for this variable attenuation, an inverse filter is selected that ideally has an amplitude-frequency response inverse to that of the line. Thus, the inverse filter and the line together should form an all-pass network, where the magnitudes of the frequency components of a message signal are attenuated equally across a desired frequency spectrum.

To determine the parameters of an inverse filter that equalizes the variable attenuation of a signal on a particular line, one prior art approach first involves measuring the attenuation of a signal at three different frequencies. From these measurements, the parameters of an inverse filter are calculated. These parameters should define an inverse filter that has a typical amplitude-frequency response and that equalizes the attenuation of the signal at the three measured frequencies. The problem with this approach is that the amplitude-frequency response of the line is assumed to be typical. However, when the amplitude-frequency response of the line varies unpredictably, this approach only equalizes the attenuation of a signal at the three measured frequencies with unacceptable variations of signal attenuation throughout the remainder of the frequency spectrum.

In applications requiring real-time determination of inverse filter parameters, the approach may be simplified by choosing the best filter from a predetermined set for a collection of typical transmission lines. This second approach has the same problem as the first approach and is less effective than the first for assuring that the variable attenuation of a message signal is equalized throughout a desired frequency spectrum.

SUMMARY OF THE INVENTION

The foregoing problems are solved and a technical advance is achieved by an arrangement utilizing linear predictive coding for equalizing over a frequency spectrum the variable attenuation of a message signal transmitted on a communication line. The message signal has a plurality of frequency components each having its own initial magnitude prior to transmission on the line. The communication line variably attenuates the initial magnitudes of the frequency component signals transmitted on the line and has a plurality of reflection coefficients that characterize the variable attenuation of the component signals on the line. The arrangement comprises a processor responsive to the reflection coefficients of the line and the message signal transmitted thereon for generating an output signal having a plurality of frequency components equivalent to those of the message signal. The magnitudes of the output signal frequency components are attenuated equally from the initial magnitudes of the corresponding frequency components of the message signal. Using linear predictive coding, the processor is also responsive to a predetermined signal transmitted on the line for ascertaining the reflection coefficients of the line.

In one illustrative embodiment of the invention, the program-controlled processor functions as an N-stage digital inverse filter. Each stage (j) of the N-stage arrangement, includes a combination of adders, multipliers, and a delay unit for processing two pluralities of input samples. A first multiplier in each stage multiplies each input sample of the first plurality by the reflection coefficient $K(j)$ of the stage. The delay unit in each stage delays each input sample of the second plurality a predetermined period such as one time period of the samples. Each sample in the first and the delayed second plurality of input samples has a corresponding sample in the other plurality of input samples. A second multiplier in each stage multiplies the delayed input samples by the reflection coefficient $K(j)$ of the stage. Lastly, a first and a second adder are included for each stage. The first adder adds each input sample from the first plurality and the corresponding delayed and multiplied sample from the second plurality to form a first plurality of output samples. The second adder adds each multiplied sample from the first plurality and the corresponding delayed sample from the second plurality to form a second plurality of output samples. A plurality of message samples representative of the message signal transmitted on the line constitutes the first and second pluralities of input samples for the first stage of the N-stage filter. The first and second pluralities of output samples from each stage (j) of the filter are the first and second pluralities of input samples for the next stage $(j+1)$ of the filter, respectively. The first plurality of output samples from the last stage (N) of the filter represents the transmitted message signal equalized over a desired voice-frequency spectrum for the variable attenuation caused by the line. The processor uses linear predictive coding and this filter structure to calculate the reflection coefficient $K(j)$ of each stage of the filter in response to a spectrally white test signal transmitted on the line.

In accordance with one feature of this invention, the arrangement is responsive to a first set of program instructions for generating the equalized output signal. Using linear predictive coding, the processor is also responsive to a second set of program instructions for ascertaining the reflection coefficients of the line.

In accordance with another feature of this invention, the arrangement emphasizes the variably attenuated spectrally white test signal above and below the desired frequency spectrum. This causes the arrangement to function also as a bandpass filter when message signals are received from the line.

In accordance with still another feature of this invention, the arrangement converts an analog message signal from the line to a plurality of digital message samples and also converts the digital output samples to an analog output message signal equalized for the variable attenuation caused by the communication line.

BRIEF DESCRIPTION OF THE DRAWING

The invention may be better understood from the following detailed description when read with respect to the drawing in which:

FIG. 7 depicts a flow diagram of a program instruction routine that controls the operation of the digital arrangement in an equalization mode.

DETAILED DESCRIPTION

Figure 1:
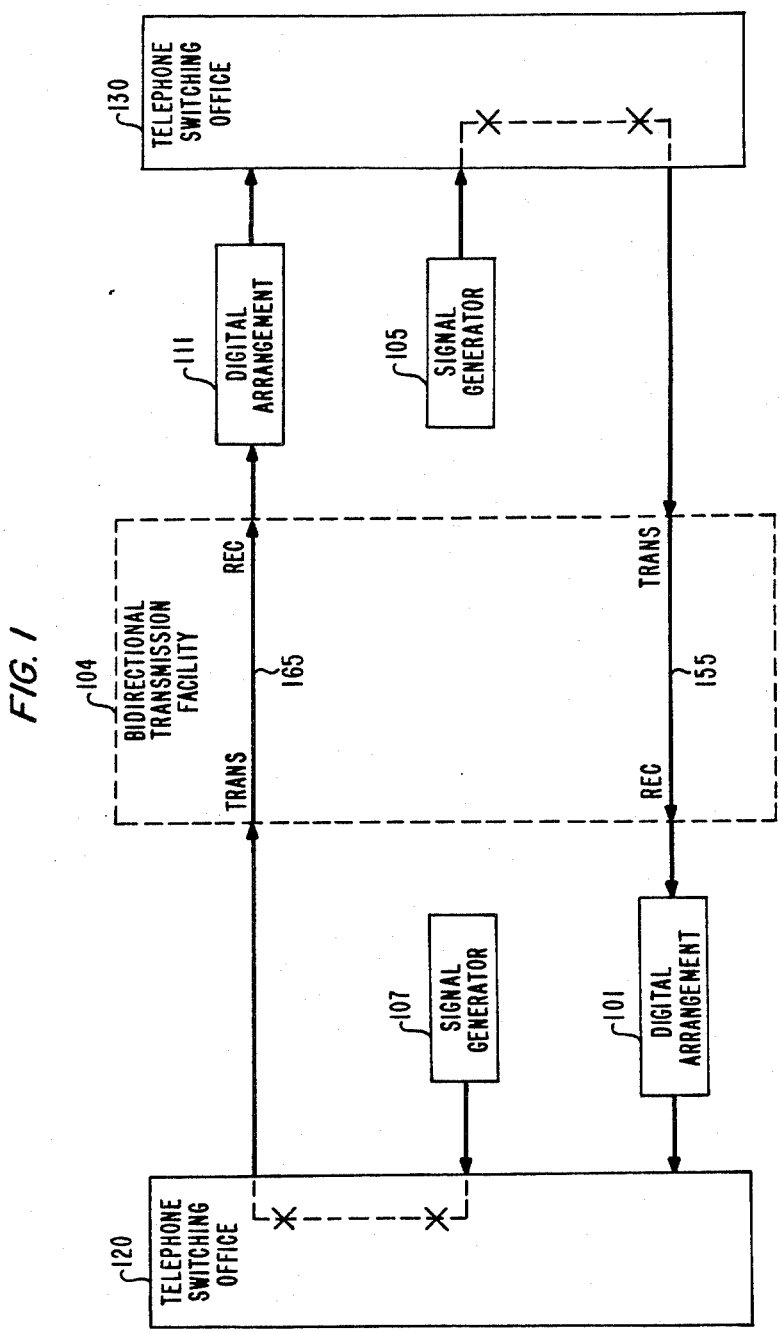
FIG. 1 depicts a block diagram of an illustrative digital arrangement utilizing linear predictive coding for equalizing over a desired frequency spectrum the variable attenuation of a voice-frequency message signal transmitted on a communication line between two telephone switching offices.

Depicted in FIG. 1 are illustrative digital arrangements 101 and 111 each utilizing linear predictive coding for equalizing over a desired frequency spectrum the variable attenuation of a voice-frequency message signal transmitted on respective communication lines 155 and 165. Unidirectional lines 155 and 165 are part of any well-known four-wire bidirectional transmission facility such as 104 that interconnects telephone switching offices 120 and 130. Connected between the receive end of communication line 155 and switching office 120, digital arrangement 101 equalizes voice-frequency message signals transmitted on the line from switching office 130. Similarly connected, digital arrangement 111 equalizes message signals transmitted on communication line 165 from switching office 120.

In accordance with this invention, each of digital arrangements 101 and 111 has a measurement and an equalization mode. In the measurement mode, each arrangement receives a predetermined spectrally white test signal that has been variably attenuated by the line. This variable attenuation over the frequency spectrum of the signal may be characterized by the reflection coefficients of the line. Signal generator 105, which is a well-known device, generates the predetermined spectrally white test signal that is applied to the transmit end of communication line 155 through switching office 130. For example, this test signal comprises a periodic impulse train having a period of 19.875 milliseconds. Similarly, signal generator 107 generates the predetermined spectrally white test signal that is applied to the transmit end of communication line 165 through switching office 120. In response to the received test signal variably attenuated by the line, each digital arrangement ascertains or, more particularly, calculates the reflection coefficients of the line.

In the equalization mode, each digital arrangement functions as an N-stage digital inverse filter employing the calculated reflection coefficients of the line. Together the communication line and the digital arrangement function as an all-pass network.

Telephone switching offices 120 and 130 are suitably a stored program-controlled switching system of the type disclosed in *The Bell System Technical Journal,* Volume 43, No. 5, Parts 1 and 2, September, 1964.

Figure 2:
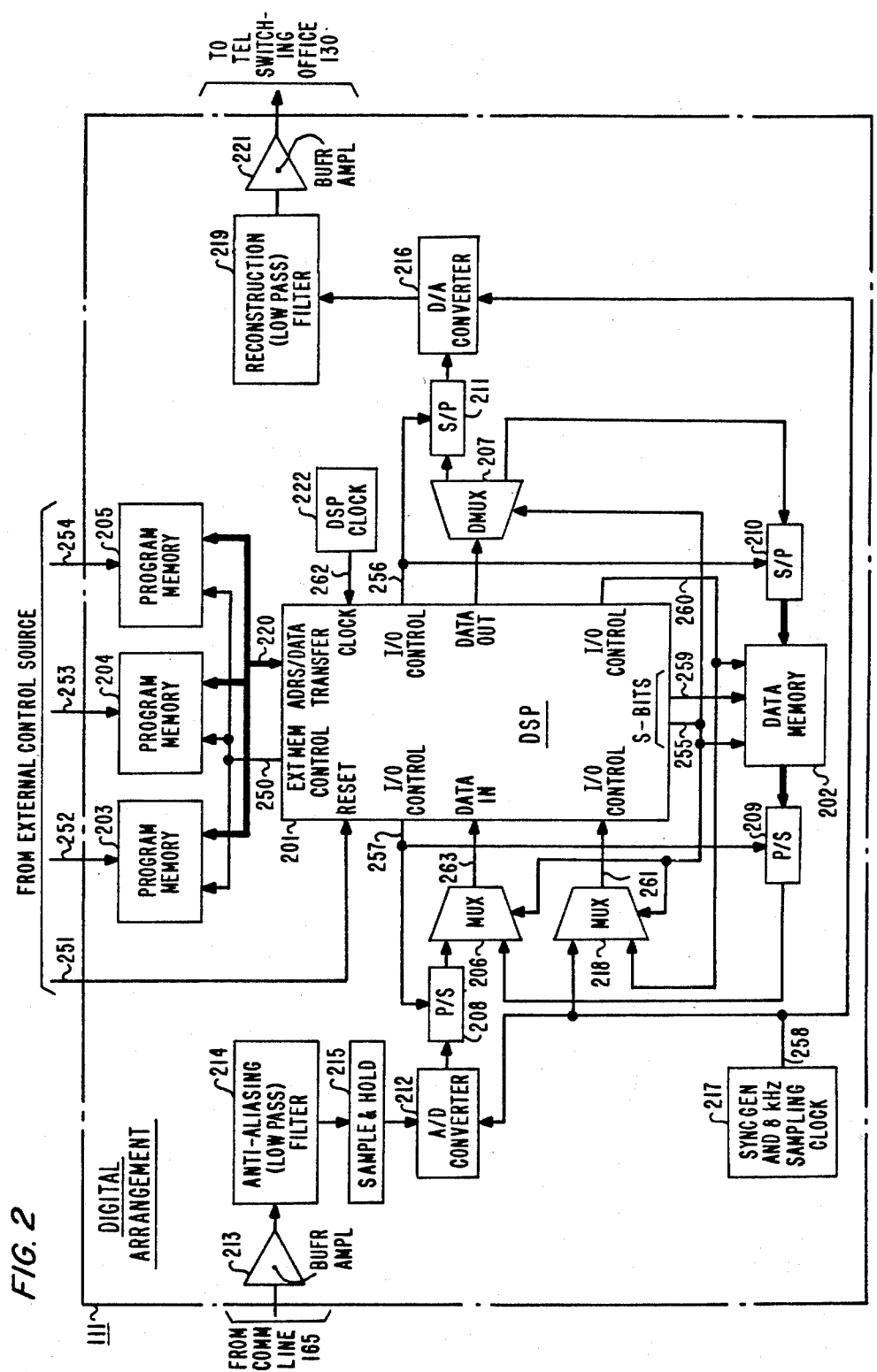
FIG. 2 depicts a detailed block diagram of a digital arrangement of FIG. 1.

FIG. 2 depicts a block diagram of digital arrangement 111 for equalizing voice-frequency message signals from communication line 165. Digital arrangement 111 comprises digital signal processor 201, data memory 202, program memories 203–205, multiplexer 206, and demultiplexer 207 along with parallel-to-serial converters 208 and 209 and serial-to-parallel converters 210 and 211 that are well-known units.

Data memory 202 is a temporary and erasable memory such as a random access memory and stores spectrally white test samples that have been variably attenuated by communication line 165. In the measurement mode, digital signal processor 201 utilizes these test samples to calculate the reflection coefficients K(j) of the line for use in an N-stage inverse filter, where j is an integer from 1 to N.

Each of program memories 203–205 is a permanent memory such as a read-only memory and stores a routine of program instructions that directs digital signal processor 201 to sequentially perform its many functions.

For example, program memories 203 and 204 store one set of program instructions. Program memory 203 stores the TEST SAMPLE SHAPING AND STORAGE ROUTINE depicted in FIG. 4. Program memory 204 stores the REFLECTION COEFFICIENT CALCULATION AND TEST SAMPLE UPDATE ROUTINE depicted in FIGS. 5 and 6. And program memory 205 stores another set of program instructions known as the EQUALIZATION ROUTINE depicted in FIG. 7. Due to the size of the routines, these three program memories are utilized in place of the internal program memory normally provided with the digital signal processor.

Digital signal processor 201 accesses program memories 203–205 via address/data transfer bus 220 and external memory control conductor pair 250. An initialization signal on reset lead 251 from an external control source initializes the processor to access one of the three program memories specified by the external control source on select leads 252–254. Thus, the external control source causes the control of the processor to be transferred from one routine to another by selecting the program memory to be accessed by the processor and initializing the processor.

Processor 201 and the program instruction set stored in program memories 203 and 204 function as a control unit utilizing linear predictive coding to calculate the reflection coefficients of line 165. Another control unit comprising processor 201 and the program instruction set stored in program memory 205 functions as an N-stage digital inverse filter employing the calculated reflection coefficients of the line. In response to a message signal having a plurality of frequency components variably attenuated by the line, the filter generates an output signal having a plurality of frequency components corresponding to the message signal with the magnitude of each output frequency component being equally attenuated over a desired frequency spectrum from the initial magnitude of the corresponding message signal frequency component.

Digital signal processor 201 is the information processing unit of the digital arrangement and executes the sets of program instructions stored in program memories 203–205. A digital signal processor suitable for use in this arrangement is described in detail in the *The Bell System Technical Journal,* Vol. 60, No. 7, September 1981, and need not be described herein for the reader to understand the present invention. In the measurement mode under the control of the TEST SAMPLE SHAPING AND STORAGE ROUTINE, digital signal processor 201 shapes and loads a plurality of predetermined samples from line 165 into data memory 202 through demultiplexer 207 and serial-to-parallel converter 210. The predetermined samples represent a spectrally white test signal that has been variably attenuated by the line. The test signal has a plurality of frequency components each having the same initial magnitude prior to transmission on the line.

Digital signal processor 201 controls the flow of data through demultiplexer 207 from the processor to either one of serial-to-parallel converters 210 and 211 via S-bit conductor pair 255. The synchronization of data through serial-to-parallel converters 210 and 211 is controlled via I/O control conductor pair 256. Similarly, the processor controls the flow of data through multiplexer 206 to the processor from either one of parallel-to-serial converters 208 and 209 via S-bit conductor pair 255. The synchronization of data through parallel-to-serial converters 208 and 209 is controlled by the processor via I/O control conductor pair 257. Clock 222 generates timing signals for the digital signal processor on clock lead 262.

Analog-to-digital converter 212 converts the analog signals from communication line 165 to well-known linear PCM digital samples after the analog signal has been passed through buffer amplifier 213, low-pass antialiasing filter 214, and sample and hold circuit 215, which are all well-known and commercially available devices. Low-pass filter 214 filters high frequency signal components above, i.e., 3.4 KHz from communication line 165. Timing for analog-to-digital converter 212 and digital-to-analog converter 216 is provided by well-known synchronization generator and 8 KHz sampling clock 217 on timing lead 258.

The digital signal processor controls the synchronization of data from either data memory 202 or line 165 via multiplexer 218. When the processor reads data out of data memory 202, it activates S-bit conductor pair 255 to multiplexers 206 and 218 and data memory 202 along with S-bit lead 259 to the data memory. This enables the data memory and multiplexer 218 to receive synchronization signals on I/O control lead 260. Multiplexer 218 passes the synchronization signals back to the processor on I/O control lead 261 so that the processor controls the synchronization of data from data memory 202. Alternatively, when the processor receives digital samples from line 165, S-bit conductor pair 255 is inactive, and multiplexer 218 passes the timing signals from synchronization generator 217 to the processor on I/O control lead 261. Thus, the synchronization generator controls the synchronization of samples from the line into digital signal processor 201. Furthermore, generator 217 controls the synchronization of data from the processor to switching office 130 through digital-to-analog converter 216, low-pass reconstruction filter 219, and buffer amplifier 221, which are all well-known and commercially available devices.

Figure 3:
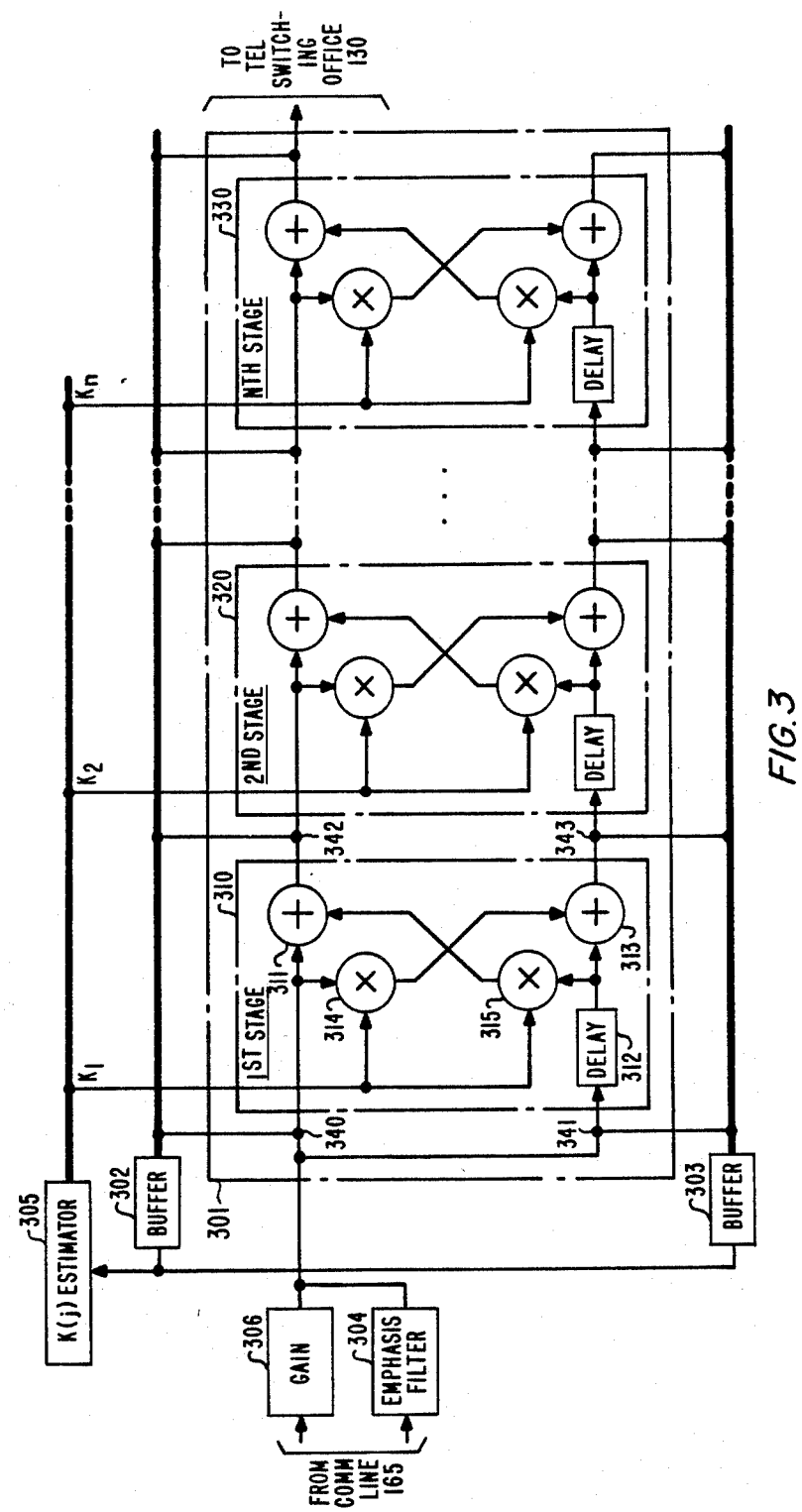
FIG. 3 depicts a detailed block diagram of another illustrative embodiment of the digital arrangement of FIG. 1.

Depicted in FIG. 3 is a detailed block diagram of another illustrative embodiment of the invention that functions equivalently to the digital signal processor embodiment. This digital filter arrangement comprises an N-stage inverse lattice filter structure 301 with respective reflection coefficients $K(1), \ldots, K(N)$; buffer memories 302 and 303; digital emphasis filter 304; $K(j)$ estimator 305; and digital gain amplifier 306. These are all well-known circuits. In the measurement mode, estimator 305 using the test samples stored in buffer memories 302 and 303 ascertains or, more particularly, calculates the reflection coefficient $K(j)$ for each stage. After the reflection coefficient for a particular stage is calculated, the test samples stored in the buffer memories are passed through the stage with the calculated reflection coefficient to update the samples. The updated samples are then returned to the buffer memories to be used in the calculation of the reflection coefficient for the next stage. This process is repeated for each stage until the reflection coefficients for all of the stages have been calculated.

In the equalization mode, message samples from line 165 are passed directly through digital gain amplifier 306 and lattice filter structure 301 to switching office 130. Thus, this inverse filter structure comprising, for example, 32 stages equalizes over a desired frequency spectrum the variable attenuation of a voice-frequency message signal transmitted on line 165. As previously suggested, this N-stage digital filter arrangement functions equivalently to digital signal processor 201 and data memory 202 under the control of the program instruction sets stored in program memories 203–205.

Each of the N-stages such as the first stage 310, the second stage 320, and the last stage (N) 330, has two input terminals such as 340 and 341 and two output terminals such as 342 and 343. Output terminals 342 and 343 are also the input terminals for the second stage 320. A digital adder circuit such as 311 interconnects a first set of input and output terminals such as 340 and 342. Interconnecting a second set of input and output terminals such as 341 and 343 are a well-known digital delay unit such as 312 and another digital adder circuit such as 313. Any samples applied to input terminal 340 are also applied to digital adder circuit 313 through a digital multiplier circuit such as 314. Samples applied to input terminal 341 are delayed one sample time period in delay unit 312 before being applied to adder circuit 311 through another digital multiplier circuit such as 315. Digital multipliers 314 and 315 multiply the value of the samples passed through the stage by the reflection coefficient $K(1)$ for the first stage.

Each of buffer memories 302 and 303 comprises L locations that are designated from zero to $L-1$ for storing L test samples. Buffer memory 302 is connected to the first set of input and output terminals such as 340 and 342 of each stage, whereas buffer memory 303 is connected to the second set of input and output terminals such as 341 and 343 of each stage. Since the N-stage digital filter arrangement functions equivalently to the arrangement comprising digital signal processor 201 and data memory 202 under the control of the software routines in program memories 203–205, the functional description of the two embodiments of the invention will be interleaved for the reader to better understand the present invention.

Figure 4:
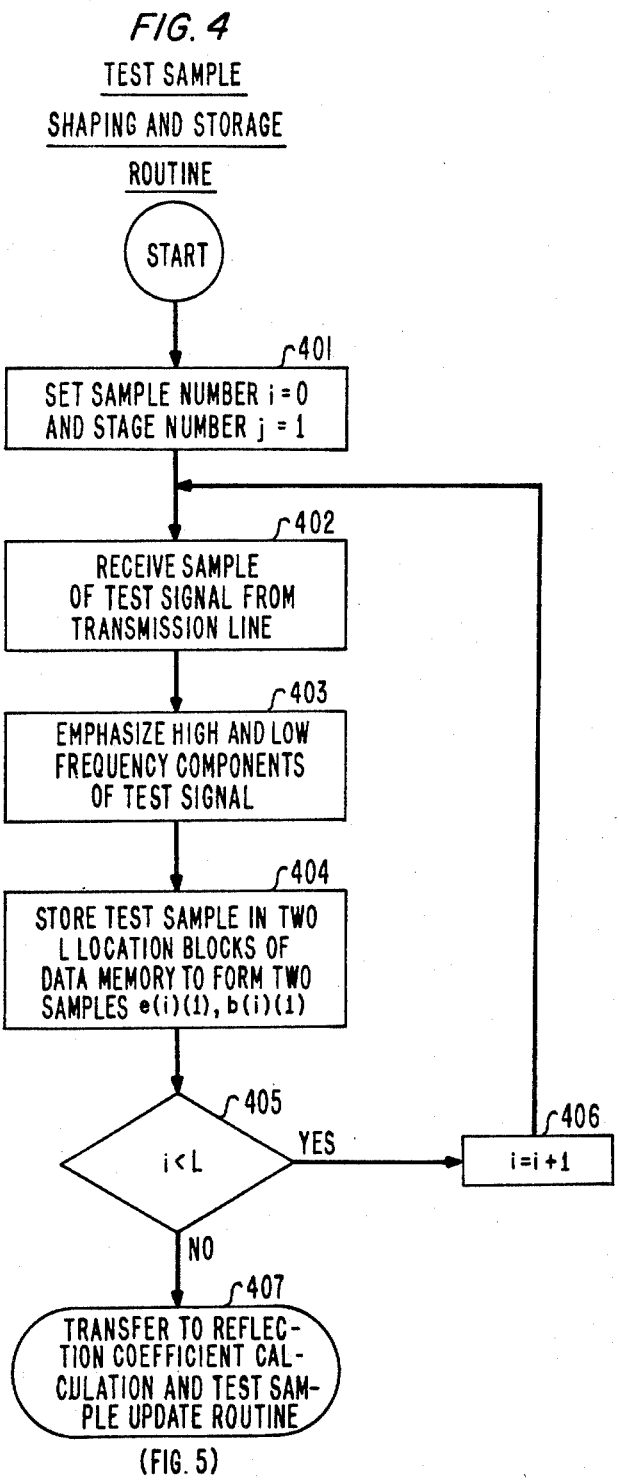
FIGS. 4 through 6 depict the flow diagrams of two program instruction routines that control the operation of the digital arrangement in a measurement mode.

When digital signal processor 201 is under the control of the TEST SAMPLE SHAPING AND STORAGE ROUTINE depicted in FIG. 4, signal generator 107 transmits a predetermined spectrally white test signal having a plurality of frequency components each of a predetermined magnitude on communication line 165 to digital arrangement 111. Analog-to-digital converter 212 converts the analog test signal to a plurality of digital test samples that are received by digital signal processor 201 on data in lead 263 (block 402). Each sample is then processed to emphasize the high and low frequency components outside a desired frequency band of the analog test signal represented by the digital samples (block 403). The processor then stores the test sample in two blocks of data memory 202. Each block has L locations. The address i of the locations in each block of memory are designated from zero to L−1. The numerical value of these two samples e(i)(1), b(i)(1) are equal (block 404). When the routine is initially entered, processor 201 first sets the sample number and block location addresses i equal to zero and the stage number j equal to one, where i again is an integer from zero to L−1 (block 401).

This storage process is repeated for each received sample until L samples, i.e., 1,908, have been stored in each data block of data memory 202 (block 405). Each time a test sample is stored, the sample number and block location addresses i are increased by one and assigned to the next received sample (block 406). When L samples have been stored in each block of data memory 202, control of the processor is transferred to the REFLECTION COEFFICIENT CALCULATION AND TEST SAMPLE UPDATE ROUTINE stored in program memory 204 (block 407). With respect to the N-stage digital filter embodiment of the invention, the digital test samples from communication line 165 are each stored in buffer memories 302 and 303 after having passed through emphasis filter 304. Buffer memories 302 and 303 are the two blocks of data memory 202. Again, the numerical value of the two samples e(i)(1), b(i)(1) stored in buffer memories 302 and 303 are equal for each received test sample.

Figure 5:
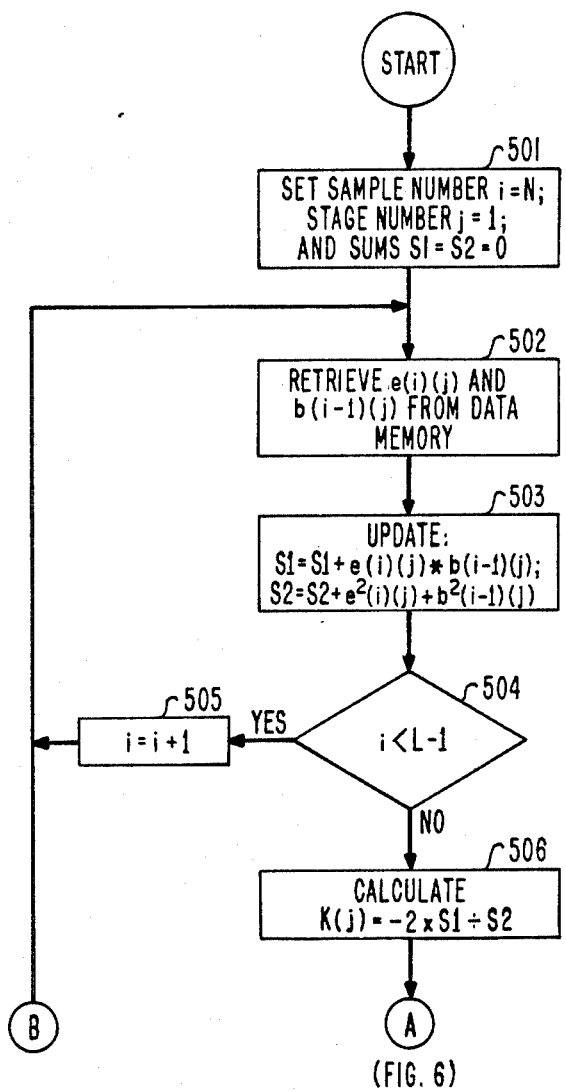

Depicted in FIG. 5 is the REFLECTION COEFFICIENT CALCULATION AND TEST SAMPLE UPDATE ROUTINE for calculating the reflection coefficients $K(1), \ldots, K(N)$ of an N-stage inverse filter using linear predictive coding and well-known Burg's lattice algorithm. According to Burg's algorithm, the reflection coefficient K(j) for the jth stage of an all-zero inverse filter network of N-stages may be ascertained by the formula:

$$K(j) = \frac{-2 \sum_{i=N}^{L-1} e(i)(j)*b(i)(j)}{\sum_{i=N}^{L-1} [e^2(i)(j) + b^2(i)(j)]},$$

where $j = 1, 2, \ldots, N$.

Under the control of this routine, the stage number j is set to one, the sample number and block location addresses i are set to N, and the two sums S1 and S2 are set to zero (block 501). Digital signal processor 201 then retrieves the two samples e(i)(j) and b(i−1)(j) from data memory 202 (block 502). The processor then updates the two sums S1 and S2 using the formulas (block 503):

$$S1 = S1 + e(i)(j)*b(i-1)(j);$$

$$S2 = S2 + e^2(i)(j) + b^2(i-1)(j).$$

These two sums are updated for each of L−N samples stored in data memory 202 incrementing the sample number and block location addresses i by one after each calculation (blocks 504 and 505). After the two sums S1 and S2 have been updated for L-N samples, the reflection coefficient K(1) for the first stage is calculated using the equation (block 506):

$$K(j) = \frac{-2*S1}{S2}.$$

Estimator 305 similarly calculates the reflection coefficient K(1) for the first stage 310.

Figure 6:
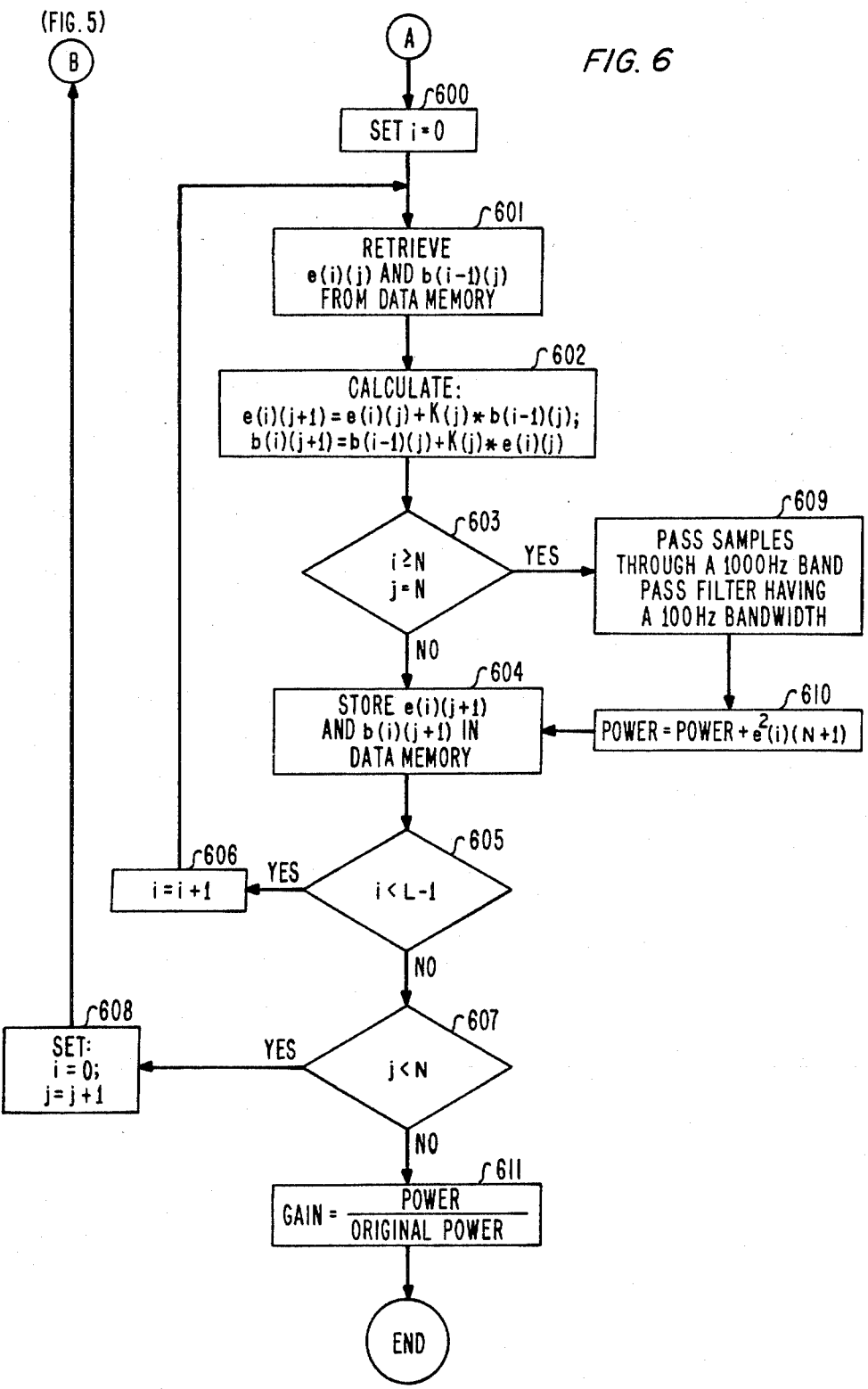

As depicted in FIG. 6, digital signal processor 201 calculates the input samples for the second stage from the test samples stored in data memory 202. First, digital signal processor sets sample number and block location addresses i to zero and retrieves the first two samples e(i)(j), b(i−1)(j) from data memory 202 (block 600 and 601). Next, the input samples for the second stage are calculated using the equations (block 602):

$$e(i)(j+1) = e(i)(j) + K(j)*b(i-1)(j)$$

$$b(i)(j+1) = b(i-1)(j) + K(j)*e(i)(j).$$

The input samples e(i)(j+1), b(i)(j+1) are stored in data memory 202 in the location of the previous two input samples e(i)(j) and b(i−1)(j) (block 604). This process is repeated for each of the L sample sets stored in data memory 202 incrementing the same number and block location addresses i by one for each sample set (blocks 605 and 606).

After the reflection coefficient has been calculated for the first stage of the inverse filter network depicted in FIG. 3, the test samples from line 165 originally stored in buffer memories 302 and 303 are passed through the first stage of the filter arrangement using the newly calculated reflection K(1) to obtain two sets of updated samples e(i)(j+1) on output terminal 342 and b(i)(j+1) on output terminal 343. The output samples of the first stage are also the input samples for the second stage and are used to calculate the reflection coefficient therefore. These updated samples are returned to their previous locations in buffer memories 302 and 303.

The reflection coefficient K(2) for the second stage is then calculated again (blocks 607 and 608) using Burg's algorithm depicted in FIG. 5. Digital signal processor 201 then updates the input samples for the second stage by using the newly calculated reflection coefficient for the second stage to obtain the input samples for the third stage (blocks 600 through 606). Similarly, after the reflection coefficient K(2) for the second stage 320 has been calculated by estimator 305, the input samples from buffer memories 302 and 303 are passed through second stage 320 of the lattice network and returned to their previous locations.

The reflection coefficient for each of the N stages is calculated along with updating the samples that are stored in either data memory 202 or equivalent buffer memories 302 and 303. When the output samples for the last stage are processed, the samples are passed through a digital 1000 hertz bandpass filter with a 100 hertz bandwidth to calculate the gain of a digital gain amplifier such as 306 in FIG. 3 (blocks 609 and 610). The digital gain amplifier is used to amplify the message samples in the equalization mode of the two embodiments. The gain of this amplifier is determined using the well-known gain formula (block 611):

$$\text{Gain} = \frac{\text{Power}}{\text{Original Power}}.$$

After having determined the reflection coefficients for each of the N stages, digital arrangement 111 assumes the equalization mode under the control of the EQUALIZATION ROUTINE stored in program memory 205. Under the control of the EQUALIZATION ROUTINE depicted in FIG. 7, digital signal processor 201 functions as an N-stage inverse filter such as 301 depicted in FIG. 3. This is accomplished by taking each of the message samples from communication line 165 and processing the message samples through the various stages with the previously calculated reflection coefficients. First, processor 201 sets delayed input sample bd(1) to zero (block 700). Next, the processor retrieves a message sample designated e(1) from transmission line 165 and sets stage number j to one and input sample b(1) equal to input sample e(1)(-block 701). The output samples of the first stage and the input samples for the second stage are then calculated using the formulas (block 703):

$$e(j+1)=e(j)+K(j)bd(j);$$

$$b(j+1)=bd(j)+K(j)e(j).$$

The delayed input sample bd(j) is set equal to the input sample b(j)(block 704), the stage number j is incremented by one (block 705), and the input samples for the remaining stages of the filter are calculated (blocks 702–705). The first output sample e(N+1) of the last stage (N) is placed on the transmission line and sent to switching office 130 (block 706). This process is repeated for each input sample received from communication line 165 to generate a plurality of output samples representative of the message signal equalized over a predetermined frequency spectrum for the variable attenuation caused by the communication line.

With respect to the N-stage embodiment depicted in FIG. 3, the message samples are applied to lattice network 301 after amplification by gain amplifier 306. The N-stage inverse lattice filter passes a plurality of the input samples to form a plurality of output samples also representative of the message signal equalized over a predetermined frequency spectrum for the variable attenuation caused by the line. Furthermore, since the test samples were passed through an emphasis filter such as 304 that emphasized the test frequency component signals above and below the desired frequency band or spectrum, the inverse filter arrangement in both embodiments performs the inverse function and functions as a bandpass filter for the message samples received in the equalization mode.

It is to be understood that the above-described arrangements are merely illustrative embodiments of the principles of this invention and that numerous other arrangements may be devised by those skilled in the art without departing from the spirit and scope of the invention. In particular, the digital arrangements may be modified to connect through a hybrid circuit at each end of a two-wire communication line. Thus, the digital arrangement at each end of the two-wire communication line will equalize a message signal transmitted in only one direction on the two-wire line.

What is claimed is:

1. An arrangement for equalizing over a frequency spectrum the varable attenuation of a message signal transmitted on a communications line, said message signal having a first plurality of frequency components in said spectrum each component having its own initial magnitude prior to transmission on said line, said line variably attenuating the initial magnitudes of said first plurality of frequency components during the transmission of said message signal thereon and having a plurality of reflection coefficients characteristic of the variable attenuation of said message signal; said arrangement comprising processor means responsive to said reflection coefficients and said message signal transmitted on said line for generating an output signal having a second plurality of frequency components corresponding to said first plurality of frequency components, the magnitudes of said second plurality of frequency components over said frequency spectrum being attenuated equally from the initial magnitude of the corresponding frequency component of said first plurality of frequency components, wherein said processor means includes means responsive to a predetermined signal transmitted on said line and using linear predictive coding for ascertaining said reflection coefficients.

2. The arrangement in accordance with claim 1 in which said processor means further comprises means for storing a first set of instructions and wherein said processor means is responsive to said first set of instructions for generating said output signal.

3. The arrangement in accordance with claim 2 in which said processor means further comprises means for storing a second set of instructions and wherein said processor means is responsive to said second set of instructions for ascertaining said reflection coefficients.

4. The arrangement in accordance with claim 3 wherein said predetermined signal transmitted on said line has a third plurality of frequency components each having a predetermined magnitude and in which said arrangement further comprises means for emphasizing the magnitudes of said third plurality of frequency components in a predetermined manner.

5. The arrangement in accordance with claim 3 in which said arrangement further comprises converter means for converting said message signal transmitted on said line to a plurality of input message samples and wherein said processor means is responsive to said input message samples for generating a plurality of output samples representative of said output signal.

6. The arrangement in accordance with claim 5 in which said arrangement further comprises converter means for converting said plurality of output samples to said output signal.

7. An arrangement for equalizing over a frequency spectrum the variable attenuation of a message signal transmitted on a communications line, said message signal having a first plurality of frequency components in said spectrum each component having its own initial magnitude prior to transmission on said line, said line variably attenuating the initial magnitudes of said first plurality of frequency components during the transmission of said message signal thereon and having a plurality of reflection coefficients characteristic of the attenuation of said message signal; said arrangement comprising:

first control means responsive to said reflection coefficients and said message signal transmitted on said line for generating an output signal having a second plurality of frequency components corresponding to said first plurality of frequency components, the magnitudes of said second plurality of frequency components over said frequency spectrum being attenuated equally from the initial magnitude of the corresponding frequency component of said first plurality of frequency components; and second control means responsive to a predetermined signal transmitted on said line and using linear predictive coding for ascertaining said reflection coefficients.

8. The arrangement in accordance with claim 8 in which said first control means comprises program memory means for storing a first set of instructions and wherein said first control means is responsive to said first set of instructions for generating said output signal.

9. The arrangement in accordance with claim 8 in which said second control means comprises program memory means for storing a second set of instructions wherein said second control means is responsive to said second set of instructions for ascertaining said reflection coefficients.

10. The arrangement in accordance with claim 7 in which said arrangement further comprises data memory means for storing said predetermined signal transmitted on said line.

11. The arrangement in accordance with claim 7 wherein said predetermined signal transmitted on said line has a third plurality of frequency components each having a predetermined magnitude and in which said arrangement further comprises filter means for emphasizing the magnitudes of said third plurality of frequency components in a predetermined manner.

12. The arrangement in accordance with claim 7 in which said arrangement further comprises converter means for converting said message signal transmitted on said line to a plurality of input message samples and wherein said first control means is responsive to said input message samples for generating a plurality of output message samples representative of said output signal.

13. The arrangement in accordance with claim 7 in which said arrangement further comprises converter means for converting said predetermined signal transmitted on said line to a plurality of predetermined samples each having a time period and memory means for storing said predetermined samples and wherein said reflection coefficients:

$$K(j) = \frac{-2 \sum_{i=N}^{L-1} e(i)(j)*b(i-1)(j)}{\sum_{i=N}^{L-1} [e^2(i)(j) + b^2(i-1)(j)]};$$

where: j is an integer from 1 to N;
i is an integer from N to L−1;
e(i)(1)=b(i)(1)=a numerical representation of the amplitude of the ith sample of said predetermined samples;

$e(i)(j+1)=e(i)(j)+K(j)*b(i-1)(j);$ $b(i)(j+1)=b(i-1)(j)+K(j)*e(i)(j);$ and
b(i−1)(j)=b(i)(j) delayed one said time period.

14. An N-stage digital filter arrangement for use with a communications line, where N is an integer; comprising:
estimator means using linear predictive coding and responsive to a plurality of predetermined samples representative of a predetermined signal from said line for ascertaining a reflection coefficient K(j) for each stage of said filter arrangement, each stage (j), where j is an integer from 1 to N, comprising:

first multiplier means for multiplying each sample of a first plurality of input samples by the reflection coefficient K(j);
delay means for delaying each sample of a second plurality of input samples a predetermined time period, the samples of said first and second pluralities of input samples each having said predetermined time period, each delayed sample in said second plurality of input samples having a corresponding sample in said first plurality of input samples;
second multiplier means for multiplying each delayed sample of said second plurality of input samples and by the reflection coefficient K(j);
first adder means for adding each delayed and multiplied sample of said second plurality of input samples and the corresponding sample of said first plurality of input samples to form a first plurality of output samples;
second adder means for adding each delayed sample of said second plurality of input samples and the corresponding multiplied sample of said first plurality of input samples to form a second plurality of output samples; a plurality of message samples representative of a message signal from said line constituting the first and the second pluralities of input samples for the first stage (1) of said N-stage filter arrangement; the first and second pluralities of output samples from the jth stage (j) of said filter arrangement constituting the first and second pluralities of input samples for the next stage (j+1) of said filter arrangement, respectively, and the first plurality of output samples from the last stage (N) of said filter arrangement being representative of an output signal, said output signal being representative of said message signal equalized over a desired frequency spectrum for the variable attenuation of said message signal on said line.

15. The filter arrangement in accordance with claim 14 in which said arrangement further comprises:
first buffer means for storing L samples of said predetermined samples in L locations contained therein and designated from 0 to L−1, respectively where L is an integer, and
second buffer means for storing said L samples in L locations contained therein and designated from 0 to L−1, respectively, and wherein said estimator means ascertains the reflection coefficients using the formula:

$$K(j) = \frac{-2 \sum_{i=N}^{L-1} e(i)(j)*b(i-1)(j)}{\sum_{i=N}^{L-1} [e^2(i)(j) + b^2(i-1)(j)]};$$

where: i is an integer from N to L−1;
e(i)(1)b(i)(1)=the numerical value of the ith sample of said L samples stored in the ith designated location in said first buffer means; and $e(i)(j+1)=e(i)(j)+K(j)*b(i-1)(j);$ $b(i)(j+1)=b(i-1)(j)+K(j)*e(i)(j);$ and b(i−1) (j)=b(i)(j) delayed said predetermined time period and stored in the (i−1)th designated location in said second buffer means.

16. The filter arrangement in accordance with claim 14 in which said filter arrangement further comprises low-pass filter means for filtering said predetermined and message signals from said communications line in a predetermined manner.

17. The filter arrangement in accordance with claim 14 in which said filter arrangement further comprises means for multiplying each of said message samples from said communications lines by a gain factor.

18. The filter arrangement in accordance with claim 14 in which said filter arrangement further comprises means for converting said message signal from said transmission line to said message samples.

19. The filter arrangement in accordance with claim 14 in which said filter arrangement further comprises means for converting said output samples to said output message signal.

* * * * *